United States Patent [19]

Hayakawa et al.

[11] Patent Number: 4,860,297

[45] Date of Patent: Aug. 22, 1989

[54] QUANTUM WELL SEMICONDUCTOR LASER DEVICE

[75] Inventors: Toshiro Hayakawa, Nara; Takahiro Suyama, Tenri; Kohsei Takahashi, Tenri; Masafumi Kondo, Tenri; Saburo Yamamoto, Nara, all of Japan

[73] Assignee: Sharp Kabushiki Kaisha, Japan

[21] Appl. No.: 81,403

[22] Filed: Aug. 4, 1987

[30] Foreign Application Priority Data

Aug. 8, 1986 [JP] Japan ................................ 61-187389
Apr. 22, 1987 [JP] Japan ................................ 62-99318

[51] Int. Cl.$^4$ ............................................... H01S 3/19
[52] U.S. Cl. ................................................... 372/45
[58] Field of Search ...................... 372/45, 44; 357/16, 357/17

[56] References Cited

U.S. PATENT DOCUMENTS 4,573,161  2/1986  Sakai et al. ............................. 372/45
4,644,378  2/1987  Williams ................................ 372/46
4,750,182  6/1988  Takahashi et al. ..................... 372/45

FOREIGN PATENT DOCUMENTS 0166593   1/1986  European Pat. Off. .
0176087   4/1986  European Pat. Off. .
0206496  12/1986  European Pat. Off. .
21316106  6/1984  United Kingdom .

OTHER PUBLICATIONS

Tokuda et al., (1986) J. Appl. Phys. 60(8):2729-2734.

*Primary Examiner*—James W. Davie
*Attorney, Agent, or Firm*—Irell & Manella

[57] ABSTRACT

In a semiconductor laser device comprising $In(Ga_{1-x}Al_x)P$ cladding layers and an active region which has one or more $In(Ga_{1-y}Al_y)P$ ($y<x$) quantum well layers and which is sandwiched by said cladding layers, superlatticed structures having an altervative lamination of $In(Ga_{1-x}Al_x)P$ layers and $In(Ga_{1-y}Al_y)P$ layers are disposed in contact with said cladding layers and/or said quantum well layers.

5 Claims, 5 Drawing Sheets

QUANTUM WELL SEMICONDUCTOR LASER DEVICE

BACKGROUND OF THE INVENTION

1. Field of the invention:

This invention relates to an semiconductor laser device which is useful in, for example, a compact disc player or video disc player and has an oscillation wavelength in the visible shortwave region, especially, a high quality semiconductor laser device which can be readily produced by a single crystal growth technique for forming thin films such as molecular beam epitaxy (MBE), metal-organic chemical vapor deposition (MO-CVD) etc.

2. Description of the prior art:

In the fields of compact disc players, laser beam printers, etc., a gas laser such as a He-Ne gas laser or Ar ion laser has been used as a light source. Since an AlGaAs laser device having an oscillation wavelength of 780 nm began to be practically used for replaying a compact disc, however, a semiconductor laser device having an oscillation wavelength in the visible region has been used widely in various systems such as compact disc players, laser beam printers, etc., and the range of its application fields expands rapidly. If a semiconductor laser device having a shorter oscillation wavelength is used in such a system, the performance of the system will be greatly improved. Under such a circumstances, it has been strongly desired to develop a semiconductor laser device having a shorter oscillation wavelength.

To comply with this demand, researches for developing a semiconductor laser device having an oscillation wavelength of 632.8 nm at which a He-Ne gas laser oscillates have been conducted using an InGaAlP semiconductor material which may oscillate at such a wavelength and has excellent properties. Usual InGaAlP semiconductor laser devices have a double heterojunction structure which is common in the art and in which an active layer having a thickness of about 0.1 $\mu$m is formed.

In order to attain a laser oscillation at a lower current level, it has been proposed to provide such semiconductor laser devices with a separate confinement heterostructure (SCH) and/or a multiquantum well structure. In the SCH structure, very thin quantum well layers having a thickness which is not much exceeding the de Broglie wavelength (about 100 Å) are formed as an active layer, and an optical guide layer having a thickness of several hundred Å to several thousand Å is formed between cladding layers and the active layer. In the multi-quantum well structure, the active layer comprises many quantum wells and barrier layers disposed between the quantum wells. As a result of employing such a structure, the interaction between the quantum wells and laser beam is strengthened. A conventional AlGaAs semiconductor laser device having such a structure can be produced by MBE in a relatively easy manner, because a lattice matching between the GaAs substrate and the AlGaAs layers can be achieved by changing the AlAs mole fraction and only three kinds of elements are to be used.

An example of the production process of a conventional AlGaAs semiconductor laser device having a multi-quantum well structure of a graded-index separate-confinement heterostructure (GRIN-SCH) type will be described below. FIG. 9 is a graph showing a distribution of the AlAs mole fraction near the oscillation region of the device. As shown in FIG. 9, the device comprises $Al_{0.8}Ga_{0.2}As$ cladding layers 21, $Al_xGa_{1-x}As$ ($0.4 \leq x 0.8$) graded-index optical guiding layers (hereinafter, referred to "GRIN optical guiding layers") 22, $Al_{0.2}Ga_{0.8}As$ quantum well layers 20, and $Al_{0.4}Ga_{0.6}As$ guiding layers 23. The quantum well layers 20 and guiding layers 23 constitute a multiquantum well structure 24. When the device is to be produced by MBE, the number of cells to be used is six in total, i.e., three cells for group III elements (two Al cells and one Ga cell); one As cell; and two cells for dopants (Si and Be). One of the Al cells (the first Al cell) is set so as to produce a molecular beam strength which is suitable for providing the AlAs mole fraction of the $Al_{0.2}Ga_{0.8}As$ quantum well layers 20. In other words, during the formation of the regions shown in FIG. 9, the first Al cell supplies an Al molecular beam of a constant strength. The other Al cell (the second Al cell) is controlled so as to be closed during the growth of the quantum well layers 20, and to be opened during the growth of the other layers, i.e., the cladding layers 21, the GRIN optical guiding layers 22, and the barrier layers 23. During the growth of the GRIN optical guiding layers 22, the temperature of the second Al cell is changed so that the AlAs mole fraction varies continuously. In this way, a visible semiconductor laser device having AlGaAs quantum well layers can be readily produced by MBE. In contrast, when a laser device having GaAs quantum well layers is to be produced, Al can be supplied by only one Al cell because Al is not contained in the quantum well layers.

FIG. 10 is a graph showing a distribution of the Al mole fraction near the oscillation region of an example of a conventional GRIN-SCH AlGaAs semiconductor laser device having a single-quantum well structure. In the device, an $Al_{0.8}Ga_{0.2}As$ cladding layer 32, an $Al_xGa_{(1-x)}As$ ($0.4 \leq x \leq 0.8$) optical guiding layer 33, a single $Al_{0.2}Ga_{0.8}As$ quantum well layer 37, an $Al_xGa_{(1-x)}As$ optical guiding layer 35, and an $Al_{0.8}Ga_{0.2}As$ cladding layer 36 are formed in sequence.

This device can be produced using the same six cells as those described above. The first Al cell is set so as to produce a molecular beam strength which is suitable for providing the AlAs mole fraction of the $Al_{0.2}Ga_{0.8}As$ quantum well layers 37. In other words, during the formation of the regions shown in FIG. 10, the first Al cell supplies an Al molecular beam of a constant strength. The second Al cell is controlled so as to be closed during the growth of the quantum well layer 37, and to be opened during the growth of other layers, i.e., the cladding layers 32 and 36, and the GRIN optical guiding layers 33 and 35. During the growth of the GRIN optical guiding layers 33 and 35, the temperature of the second Al cell is changed so that the AlAs mole fraction varies continuously.

By contrast to the above, in the production of an $(Al_xGa_{(1-x)})_zIn_{1-z}P$ quantum well semiconductor laser device, the compositions x and z must be controlled with an accuracy of less than 1 % so that a lattice matching between the GaAs substrate and the layers formed thereon is achieved, and the use of four kinds of element makes the setting of the process conditions very complicated. Further, it is almost impossible to form with a good reproducibility GRIN optical guiding layers as shown in FIGS. 9 and 10, because the composition x must be changed while the composition z is maintained at a predetermined value.

Such a quantum well semiconductor laser device has the simplest structure when the quantum well layers consist of an InGaP ternary mixed crystal and the cladding layers consist of an InAlP ternary mixed crystal. Even when producing the simplest device, the optical guiding layers and the barrier layers must consist of an AlGaInP quaternary mixed crystal having an energy gap and refractive index which lie between those of the two ternary mixed crystals. In this case, the ratio between the (AlP+GaP) mole fraction and the InP mole fraction of each of the layers must be constant. When the layers are to be continuously grown, therefore, at least five cells for group III elements are required: one In cell, two Al cells, and two Ga cells. When the quantum well layers consist of an AlGaInP quaternary mixed crystal, one further Al cell must be prepared in addition to the abovementioned five cells, resulting in that six cells for group III elements are required in total. As seen from the above, in the production of an AlGaInP semiconductor laser device having a quantum well structure, a production apparatus having a large number of cells must be used and the components of the layers must be controlled very precisely, which cause difficulties in producing such a device and in maintaining the apparatus.

SUMMARY OF THE INVENTION

The semiconductor laser device of this invention, which overcomes the above-discussed and numerous other disadvantages and deficiencies of the prior art, comprises $In(Ga_{1-x}Al_x)P$ cladding layers and an active region which has one or more $In(Ga_{1-y}Al_y)P$ ($y<x$) quantum well layers and which is sandwiched by said cladding layers, superlatticed structures having $In(Ga_{1-y}Al_y)P$ layers are disposed in contact with said cladding layers and/or said quantum well layers.

In a preferred embodiment, said superlatticed structures are optical guiding layers disposed between said cladding layers and said active region.

In a further preferred embodiment, said superlatticed structures are barrier layers disposed between said quantum well layers.

In a further preferred embodiment, said superlatticed structures are optical guiding layers disposed between said cladding layers and said active region and are also barrier layers disposed between said quantum well layers.

Thus, the invention described herein makes possible the objects of (1) providing a semiconductor laser device stably oscillating with a wavelength of a 600 nm band at a low threshold current level; (2) providing an AlGaInP semiconductor laser device which can be produced easily, and (3) providing a semiconductor laser device which can be produced by MBE using a relatively small number of cells.

According to the present invention, a semiconductor laser device comprises $In(Ga_{1-x}Al_x)P$ cladding layers, one or more $In(Ga_{1-y}Al_y)P$ ($y<x$) quantum well layers, and optical guiding layers and/or barrier layers which have a superlatticed structure consisting of an alternative lamination of the two or more kinds of InGaAlP mixed crystal forming the cladding layers and quantum well layers. The superlatticed structure of the optical guiding layers may be formed so as to have an SCH structure or a multi-quantum well structure.

The optical guiding layers have a refraction index which lies between those of the cladding layers and the quantum well layers so that the interaction between the quantum well layers and laser light is strengthened to decrease the threshold current level.

In the production of the semiconductor laser device of this invention, a lattice matching with the substrate must be achieved only at the formation of two kinds of InGaAlP mixed crystal, i.e., those constituting the cladding layers having the highest energy band gap and the quantum well layers having the lowest energy band gap, respectively, and the layers having an intermediate energy gap such as optical guiding layers or barrier layers can be formed so as to have a superlatticed structure. Therefore, a semiconductor laser device oscillating at a low threshold current level can be easily produced.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
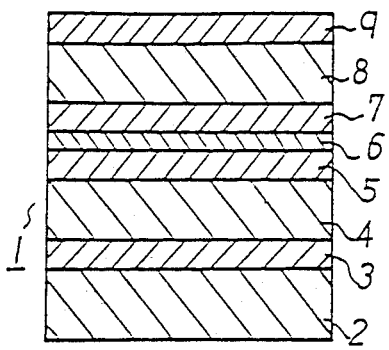
FIG. 1 is a sectional view showing an example of the semiconductor laser device of this invention.

FIG. 1 shows an $In(Ga_{1-x}Al_x)P$ SCH semiconductor laser device which is an example of this invention. The semiconductor laser device 1 has a multiquantum well structure, and is produced as follows: on the (100) face of an n-GaAs substrate (carrier density $Si=1\times10^{18}$ $cm^{-3}$) 2, an n-GaAs or $n-In_{0.5}Ga_{0.5}P$ buffer layer ($Si=1\times10^{18}$ $cm^{-3}$, the thickness thereof being 0.5 μm) 3, an $n-In_{0.5}(Ga_{0.4}Al_{0.6})_{0.5}P$ cladding layer ($Si=1\times10^{18}$ $cm^{-3}$, the thickness thereof being 1.3 μm) 4, a non-doped superlatticed optical guiding layer 5, a non-doped active layer 6 which has a multi-quantum well structure, a non-doped superlatticed optical guiding layer 7, and a $p-In_{0.5}(Ga_{0.4}Al_{0.6})_{0.5}P$ cladding layer ($Be=1\times10^{18}$ $cm^{-3}$, the thickness thereof being 1.3 μm) 8 are successively grown. Then, in another growth chamber, a p-GaAs cap layer ($Be=1\times10^{18}$ $cm^{-3}$, the thickness thereof being 0.5 μm) 9 is grown on the cladding layer 8.

Figure 2:
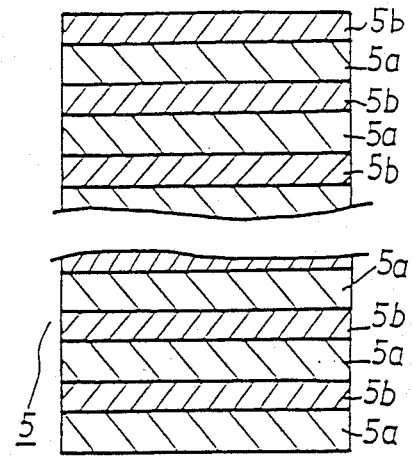
FIG. 2 is a sectional view showing an optical guiding layer of the example shown in FIG. 1.

As shown in FIG. 2, the superlatticed optical guiding layer 5 has an alternative lamination of fifty $In_{0.5}(Ga_{0.9}Al_{0.1})_{0.5}P$ layers (the thickness of each layer being 15

Figure 4:
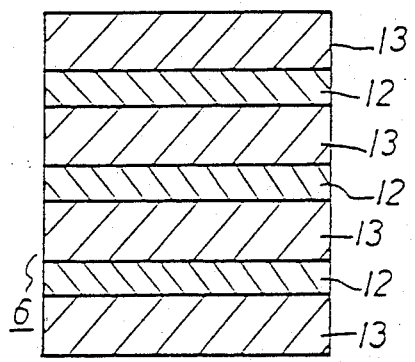
FIG. 4 is a sectional view showing the active layer of the example shown in FIG. 1.
Figure 5:
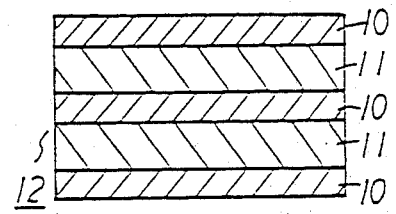
FIG. 5 is a sectional view showing the barrier layer of the active layer shown in FIG. 4.
Figure 3:
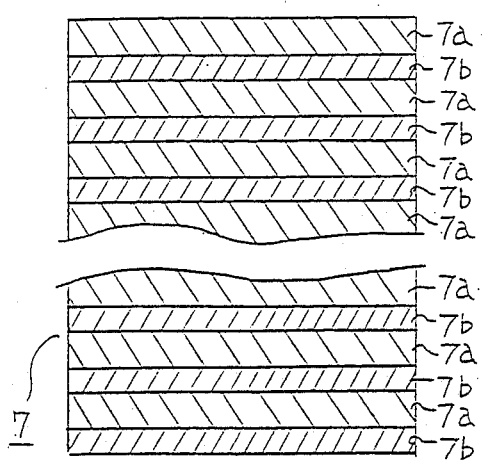
FIG. 3 is a sectional view showing another optical guiding layer of the example shown in FIG. 1.
Figure 6:
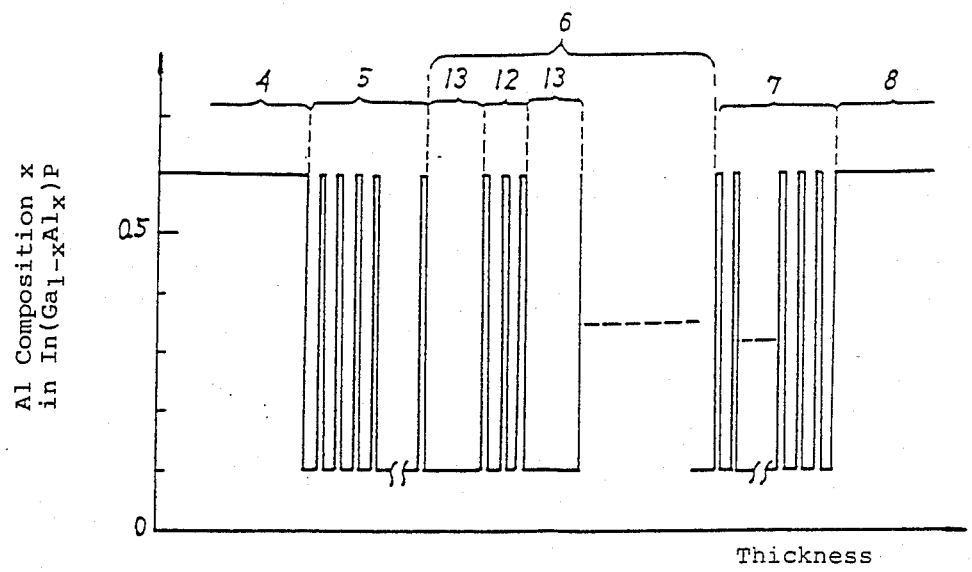
FIG. 6 is a graph showing the Al composition in the vicinity of the active region of the example shown in FIG. 1.

Å) 5a and fifty $In_{0.5}(Ga_{0.4}Al_{0.6})_{0.5}P$ layers (the thickness of each layer being 10 Å) 5b, resulting in a total thickness of 1250 Å. As shown in FIG. 4, the active layer 6 has a multi-quantum well structure which consists of an alternative lamination of three superlatticed barrier layers (the thickness being 60 Å) 12 and four $In_{0.5}(Ga_{0.9}Al_{0.1})_{0.5}P$ quantum well layers (the thickness being 100 Å) 13. Each of the barrier layers 12, as illustrated in FIG. 5, has an alternative lamination of three $In_{0.5}(Ga_{0.4}Al_{0.6})_{0.5}P$ layers (the thickness of each layer being 10 Å) 10 and two $In_{0.5}(Ga_{0.9}Al_{0.1})_{0.5}P$ layers (the thickness of each layer being 15 Å) 11. As shown in FIG. 3, the superlatticed optical guiding layer 7 has an alternative lamination of fifty $In_{0.5}(Ga_{0.4}Al_{0.6})_{0.5}P$ layers (the thickness of each layer being 10 Å) 7b and fifty $In_{0.5}(Ga_{0.9}Al_{0.1})_{0.5}P$ layers (the thickness of each layer being 15 Å) 7a, resulting in a total thickness of 1250 Å. FIG. 6 shows the distribution of the Al composition in the principle portions of the semiconductor laser device of this example.

This semiconductor laser device can be produced by MBE using five cells for group III elements, i.e., one In cell, two Al cells, and two Ga cells. The semiconductor laser device can emit a laser beam with a wavelength of 650 nm and has a threshold current level of 0.5 kA/cm$^2$ or less.

EXAMPLE 2

Figure 7:
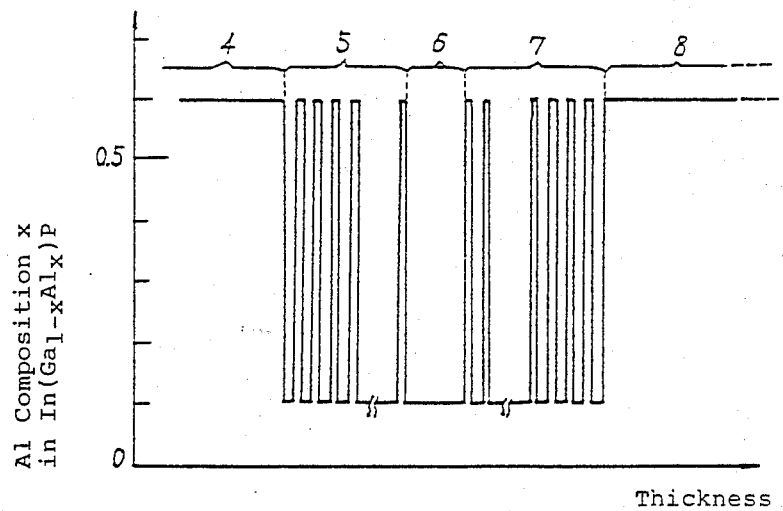
FIG. 7 is a graph showing the Al composition in the vicinity of the active region of another example of this invention.

FIG. 7 shows the distribution of the Al composition of another example of the semiconductor laser device of this invention which can be produced in the same manner except that the active layer 6 consists of a non-doped $In_{0.5}(Ga_{0.9}Al_{0.1})_{0.5}P$ single-quantum well layer. This semiconductor laser device also can be produced by MBE using five cells for group III elements. The semiconductor laser device can emit a laser beam with a wavelength of 650 nm and has a threshold current level of 0.5 kA/cm$^2$ or less.

EXAMPLE 3

Figure 8:
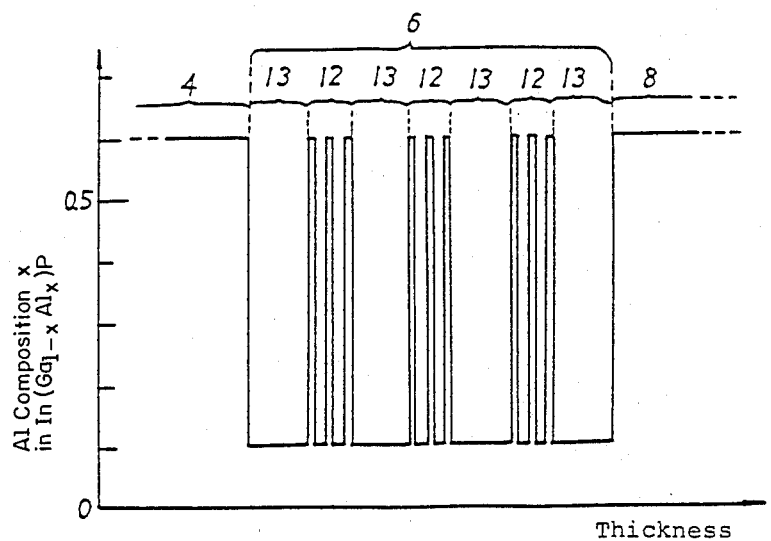
FIG. 8 is a graph showing the Al composition in the vicinity of the active region of a further example of this invention.

FIG. 8 shows the distribution of the Al composition of a further example of the semiconductor laser device of the invention. In this example, the optical guiding layers 5 and 7 shown in FIG. 1 are not formed. The active layer 6 has an alternative lamination of four $In_{0.5}(Ga_{0.9}Al_{0.1})_{0.5}P$ quantum well layers (the thickness of each layer being 70 Å) 13 and three superlatticed barrier layers 12. Each of the superlatticed barrier layers 12 consists of an alternative lamination of three $In_{0.5}(Ga_{0.4}Al_{0.6})_{0.5}P$ layers (the thickness of each layer being 5 Å) and two $In_{0.5}(Ga_{0.9}Al_{0.1})_{0.5}P$ layers (the thickness of each layer being 8 Å). The total thickness of the active layer 6 which has a multi-quantum well structure is 373 Å. This semiconductor laser device also can be produced by MBE using five cells for group III elements, and can emit a laser beam with a wavelength of 650 nm and has a threshold current level of 0.5 kA/cm$^2$ or less.

In the above-mentioned Examples 1 and 2, the optical guiding layers 5 and 7 have a superlatticed structure in which the layers 5a, 5b, 7a and 7b have a uniform thickness or period. The thickness of each of these layers may be changed so that their equivalent energy gaps decrease gradually along the direction from the cladding layer 4 or 8 to the active layer 6, resulting in forming the optical guiding layers 5 and 7 as GRIN optical waveguide layers.

Figure 9:
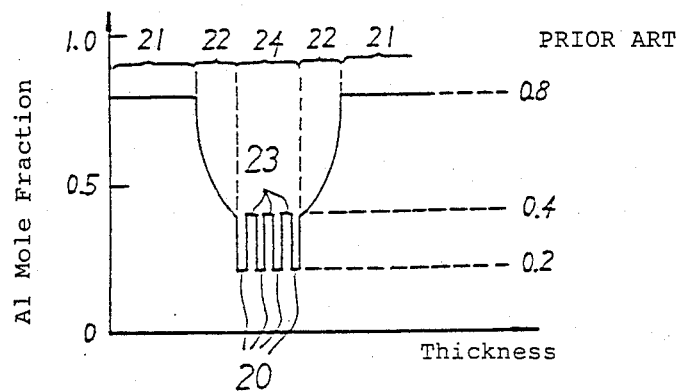
FIGS. 9 and 10 are graphs showing the Al composition in the vicinity of the active region of conventional GRIN-SCH quantum well semiconductor laser devices.
Figure 10:
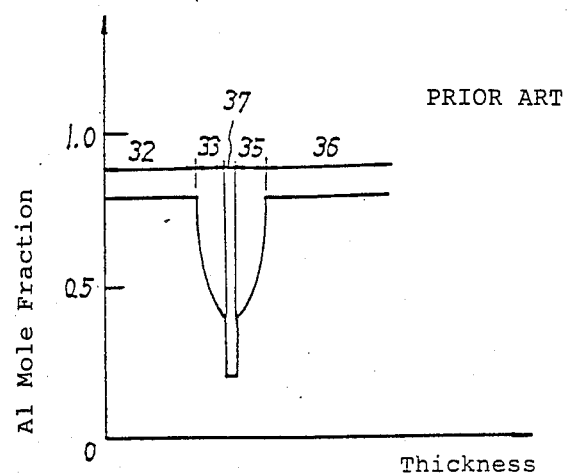

As the barrier layers 12 can be formed in almost the same manner as the superlatticed optical guiding layers 5 and 7, the barrier layers 12 in the Example 1 also are formed so as to have a superlatticed structure. However, this is not essential in this invention, and the barrier layers 12 may be formed in the same manner as the barrier layers 23 shown in FIG. 9.

When an SCH multi-quantum well semiconductor laser device having InAlP cladding layers and InGaP quantum well layers is to be produced, only three cells for group III elements (one In cell, one Al cell, and one Ga cell) are required.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising $In(Ga_{1-x}Al_x)P$ cladding layers and an active region which has one or more $In(Ga_{1-x}Al_y)P$ ($0 \leq y \leq 1$) quantum well layers and which is sandwiched by said cladding layers, superlatticed structures having an alternative lamination of $In(Ga_{1-x}Al_x)P$ layers and $In(Ga_{1-y}Al_y)P$ layers are disposed in contact with said cladding layers and said quantum well layers.

2. A semiconductor laser device according to claim 1, wherein said superlatticed structures are optical guiding layers disposed between said cladding layers and said active region.

3. In a semiconductor laser device comprising $In(Ga_{l-x}Al_x)P$ cladding layers and an active region which has one or more $In(Ga_{1-y}Al_y)P$ ($0 \leq y < x \leq 1$) quantum well layers and which is sandwiched by said cladding layers, superlatticed structures having an alternative lamination of $In(Ga_{1-x}Al_x)P$ layers and $In(Ga_{1-y}Al_y)P$ layers are disposed in contact with said quantum well layers, wherein said superlatticed structures are barrier layers disposed between said quantum well layers.

4. In a semicodnductor laser device comprising $In(Ga_{1-x}Al_x)P$ cladding layers and an active region which has one or more $In(Ga_{1-y}Al_y)P$ ($0 \leq y \leq x \leq 1$) quantum well layers and which is sandwiched by said cladding layers, superlatticed structures having an alternative lamination of $In(Ga_{1-x}Al_x)P$ layers and $In(Ga_{1-y}Al_y)P$ layers are disposed in contact with said cladding layers and said quantum well layers, wherein said superlatticed structures are optical guiding layers disposed between said cladding layers and said active region and are also barrier layers disposed between said quantum well layers.

5. In a semiconductor laser device comprising $IN(Ga_{1-x}Al_x)P$ cladding layers and an active region which has one or more $In(Ga_{1-y}Al_y)P$ ($0 \leq y \leq x \leq 1$) quantum well layers and which is sandwiched by said cladding layers, superlatticed structures having an alternative lamination of $In(Ga_{1-x}Al_x)P$ layers and $In(Ga_{1-y}Al_y)P$ layers are disposed in contact with said quantum well layers.

* * * * *